United States Patent [19]

Tanaka et al.

[11] 4,013,948
[45] Mar. 22, 1977

[54] DISCHARGE DETECTION SYSTEM FOR DETERMINING THE DISTANCE TO A DIELECTRIC WEAK POINT IN A CABLE

[75] Inventors: Shigenobu Tanaka; Hikaru Yasuhara; Munesuke Oguchi, all of Sakura, Japan

[73] Assignee: The Fujikura Cable Works, Ltd., Tokyo, Japan

[22] Filed: Aug. 12, 1975

[21] Appl. No.: 604,028

[30] Foreign Application Priority Data

Aug. 23, 1974 Japan .............................. 49-96832

[52] U.S. Cl. .................................................. 324/52
[51] Int. Cl.² .................. G01R 31/08; G01R 31/11
[58] Field of Search ............ 324/52, 181, 186, 102; 328/129; 179/175.3 F

[56] References Cited

UNITED STATES PATENTS

| | | | |
|---|---|---|---|
| 2,717,992 | 9/1955 | Weintraub | 324/52 X |
| 3,609,533 | 9/1971 | Pardis | 324/52 |
| 3,670,240 | 6/1972 | Maranchak et al. | 324/52 |

*Primary Examiner* — Gerard R. Strecker
*Attorney, Agent, or Firm* — Armstrong, Nikaido & Wegner

[57] ABSTRACT

The distance from the end of the cable to the dielectric weak point of said cable is measured by applying a D.C. high voltage to said cable and generating a discharge at the dielectric weak point, obtaining a pair of pulse signals one by differentiating a surge signal generated and the other reflected at said dielectric weak point, limiting the amplitude of said pair of pulse signals, and measuring the interval between said pair of pulse signals.

1 Claim, 4 Drawing Figures

4,013,948

DISCHARGE DETECTION SYSTEM FOR DETERMINING THE DISTANCE TO A DIELECTRIC WEAK POINT IN A CABLE

BACKGROUND OF THE INVENTION

The present invention relates to a test system of a cable, and in particular, relates to an insulation and/or spark test system of a cable.

A prior cable test system (Japanese Public Notice of patent application No. 37-14502, published Sept. 19, 1962) has a differentation circuit connected to the end of the cable to be tested, means for applying a high voltage at said end of the cable for discharging at the point where the dielectric strength is weak, a pulse transformer for transmitting a reflected pulse signal at the dielectric weak point of the cable, and means for measuring the interval of the pulse signal for the round trip to the dielectric weak point and displaying the position of the dielectric weak point.

However, the above prior system has the disadvantage that the frequency characteristics of a pulse transformer are not sufficient for transmitting the pulse signal correctly. Therefore, the pulse transformer generates an undesirable overshoot and/or back-swing waveform, which makes the result of the measurement of the distance to the dielectric weak point incorrect.

SUMMARY OF THE INVENTION

It is an object, therefore, of the present invention to overcome the disadvantages and limitations of prior cable test systems by providing a new and improved cable test system.

It is an also an object of the present invention to provide a new and improved method for testing a cable.

The above and other objects are attained by a cable test system comprising a connector for connecting a cable to be tested to the test system, a D.C. high voltage source connected between a terminal of said connector and the ground, a differentiation circuit connected to said terminal, a limiter circuit connected to the output of said differentiation circuit, a pair of pulse amplifiers connected to the output of said limiter circuit, a time counter connected to the outputs of said pulse amplifiers so as to be started and stopped by the outputs of said pulse amplifiers and a display unit connected to the output of said time counter for displaying the distance from said connector to a dielectric weak point of the cable to be tested according to the content of said time counter.

BRIEF DESCRIPTION OF THE DRAWINGS

The foregoing and other objects, features and attendant advantages of the invention will be appreciated as the same become better understood by the accompanying drawings wherein.

DESCRIPTION OF THE PREFERRED EMBODIMENT

Figure 1:
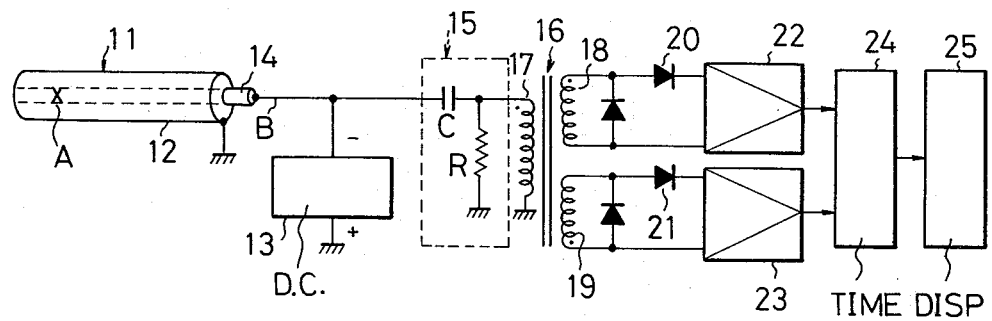
FIG. 1 is a block-diagram of the apparatus for testing a cable according to the prior art.

First, the prior test system of a cable will be explained with regard to FIG. 1 for the easy understanding of the present invention. In FIG. 1, the reference numeral 11 is a coaxial cable, the outer conductor 12 of which is grounded. 13 is a D.C. high voltage source, the positive output of which is grounded, and the negative output of which is connected to the inner conductor 14 of the coaxial cable 11. The differentiation circuit 15 having a serial capacitor C and a parallel resistor R is connected between the inner conductor 14 and the end of the primary winding 17 of the pulse transformer 16. The pulse transformer 16 has a pair of secondary windings 18, 19. The uni-directional elements like the diodes 20, 21 are connected at the end of the winding 18 and the other end of the winding 19. The other ends of the diodes 20 and 21 are connected to the inputs of the pulse amplifiers 22 and 23, respectively. Each output of the amplifiers 22 and 23 are connected to the start input and the stop input of the time counter 24, respectively. The output of the time counter 24 is connected to the display unit 25, which displays the distance from the end of the cable to the point A where the dielectric strength is weak.

Figure 2:
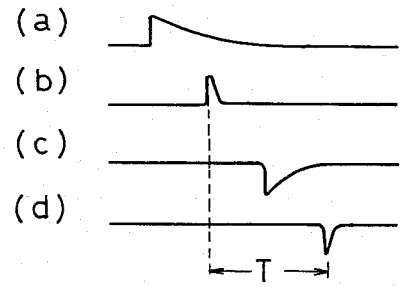
FIG. 2 shows waveforms showing the operation of the apparatus of FIG. 1.

If there is a dielectric weak portion at A, a discharge occurs at point A between the inner conductor 14 which the negative high voltage is applied to and the outer conductor 12 which is grounded. The surge voltage (FIG. 2(a) generated by the discharge at point A propagates towards the end B of the cable with the propagation speed determined by the characteristics of the cable. The surge voltage which reaches point B is differentiated by the differentiation circuit 15, which generates the positive pulse shown in FIG. 2(b). Said surge voltage is reflected at the end of the cable and propagates back to the cable 11, since the input impedance of the transformer 16 does not match the impedance of the cable, that is, the former is much higher. The reflected pulse whose phase is the same as that of the input pulse reaches point A where the dielectric strength is weak after a duration determined by the propagation speed and the distance from point B to point A. It should be noted that the impedance at point A when the reflected pulse reaches there, is still small or zero since the propagation time of a surge signal is considerably smaller than the duration of the discharge. Accordingly, the reflected pulse is reflected again, and the re-reflected pulse whose phase is opposite to the original reflected pulse propagates to point B (see FIG. 2(c)). When the re-reflected pulse reaches the measure point B, it is differentiated by the differentiation circuit 15, and the negative differentiated pulse shown is FIG. 2(d) is generated. Although the pulse signal goes and comes back between points A and B repetitively, the first two pulses (FIG. 2(b) and FIG. 2(d) are enough for the testing of the cable, since pulse signals reflected more than three times are considerably attenuated.

When the positive pulse is applied to the pulse transformer 16, the first secondary winding 18 provides an output signal to a first pulse amplifier 22 through a forward connected diode 20. The signal induced on the second secondary winding 19 by the positive input pulse is not applied to the second pulse amplifier 23 since the diode 21 is connected so as to prohibit the signal. On the other hand, when the negative pulse is applied to the transformer 16; the second secondary winding 19 provides an output signal to a second pulse amplifier 23 through the diode 21. The negative input pulse does not cause an input signal to be applied to the first pulse amplifier 22.

The time counter 24 starts counting beginning with the output signal from the first pulse amplifier 22, and finishes the same with the output signal from the second pulse amplifier 23. Counting by the time counter 24 is the function of the propagation time, that is to say, the duration (see T in FIG. 2(d)) that the pulse goes and comes back from the measure point B to the point A where the dielectric strength is weak. The result of the counting is applied to the display unit 25 where the distance relating to the duration T/2 is displayed as the length from point B to point A.

However, as mentioned before, a pulse transformer does not have the satisfactory frequency characteristics. Therefore, the undesirable output pulses like an overshoot and/or a backswing appear at the secondary windings 18 and/or 19. These undesirable pulses disturb the correct operation of the pulse amplifiers 22, 23, the time counter 24 and/or the display unit 25. Thus, the measured value sometimes becomes incorrect. Further, since a pulse transformer is expensive, the test system is made expensive, also.

Figure 3:
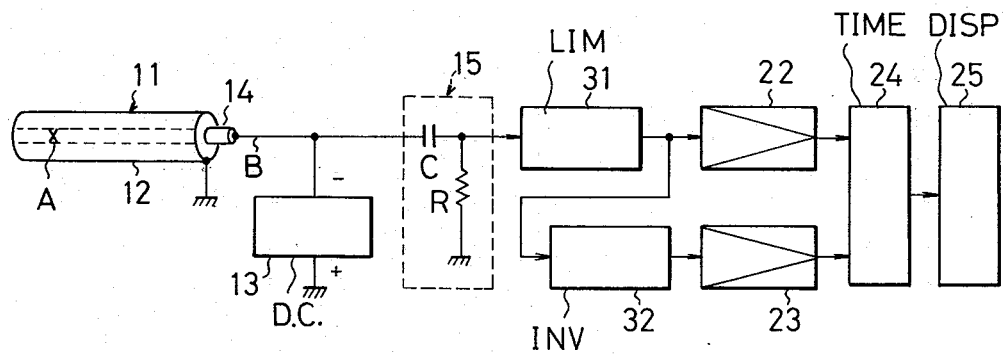
FIG. 3 is a brief block-dirgram of the apparatus for testing a cable according to the present invention.
Figure 4:
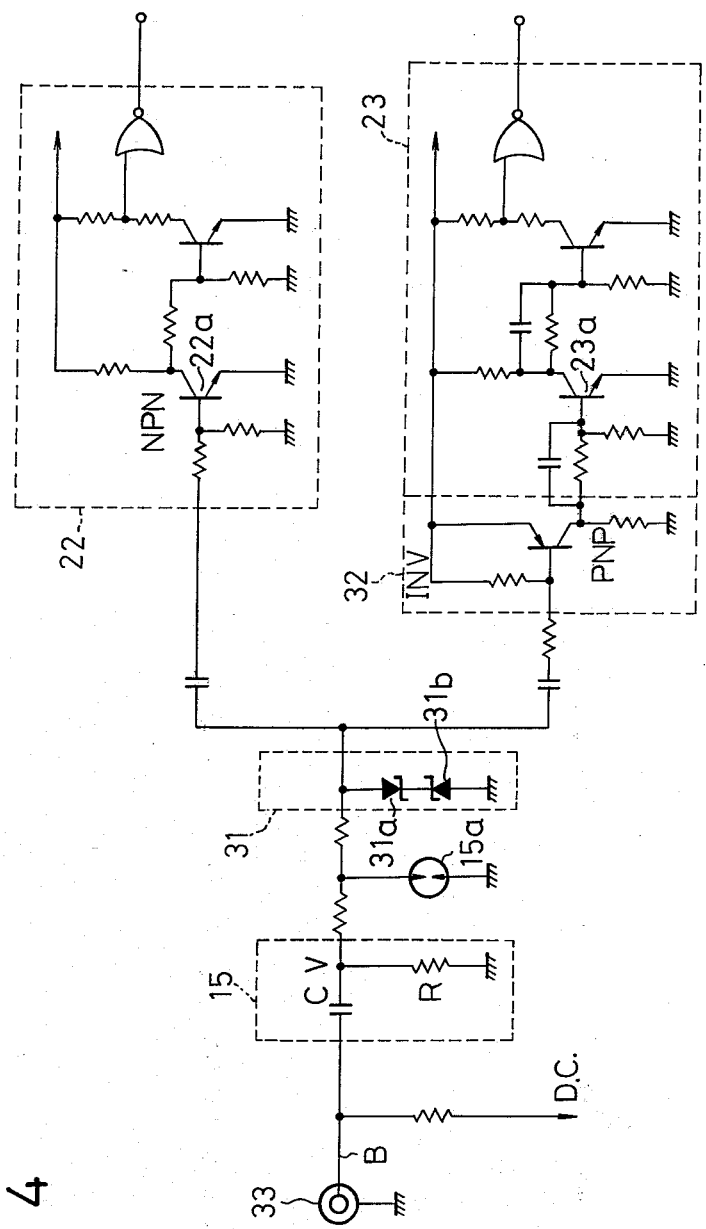
FIG. 4 is a detailed circuit diagram of the apparatus for testing a cable according to the invention.

FIG. 3 and FIG. 4 show a brief block-diagram and a detailed circuit diagram of a cable test system according to the present invention, which overcomes the drawbacks of the prior art mentioned above. The feature of FIG. 3 and FIG. 4 is the replacement of the pulse transformer 16 and the diodes 20, 21 in FIG. 1 with the limiter 31 and the inverter 32. The same members in FIG. 3 and FIG. 4 as the members in FIG. 1 have the same reference numerals, and 15a is an arrester and 33 is a connector for connecting a cable to the test system.

In FIGS. 3 and 4, the operation of the voltage source 13 and the differentiation circuit 15 is the same as that in FIG. 1, and a pair of pulses, the first positive pulse (FIG. 2(b)) and the second negative pulse (FIG. 2(d)) are applied to the limiter 31 from the differentiation circuit 15. The amplitude of these pulses are limited within a predetermined value by the limiter 31. The limiter 31 comprises a pair of zenar diodes 31a and 31b connected in series in opposite polarities as shown in FIG. 4, and the arrester 15a connected parallel with the limiter 31 improves the operation of said limiter 31 for an unimaginable high input voltage. The positive pulse from the limiter 31 is amplified and wave-shaped by the first amplifier 22. At this time, the inverter 32 applies a negative pulse to the second amplifier 23, inverting the polarity of the input positive pulse. However, the second amplifier 23 does not operate with the negative input pulse. On the other hand, the negative pulse from the limiter 31 is inverted by the inverter 32 to the positive pulse, which is amplified and wave-shaped by the second amplifier 23. The first amplifier 22 does not, of course, operate with the negative input pulse. The first amplifier 22 applies a start pulse to the time counter 24 and the second amplifier 23 applies a stop pulse to the time counter 24. Thus, the time counter 24 counts the interval T between the start pulse and the stop pulse, and according to the output of the time counter 24, the display unit 25 displays the distance to the dielectric weak point A.

Since the amplifiers 22 and 23 in FIG. 4 have NPN transistors 22a and 23a whose emitters are directly grounded, these transistors 22a and 23a operate with only positive pulses. It is possible to design the inverter 32 so that it operates with only a negative input pulse. For that purpose, all that it needed is an NPN transistor (not shown) attached to the input circuit of the inverter 32. Further, if the second amplifier 23 is designed to operate with only a negative input pulse, the inverter 32 can be omitted. If the positive electrode of the D.C. high voltage source 13 is connected to the inner conductor 14 and the negative electrode of the same is grounded, the negative differentiation pulse appears first and the positive differentiation pulse follows. In that case, the operational characteristics of the amplifiers 22 and 23 must be designed to match with the polarities of the high voltage source, or the connections between the amplifiers 22, 23 and the time counter 24 must be changed to match with the polarities of the high voltage source.

As mentioned above, according to the present invention the input signal to the amplifiers 22 and 23 does not suffer from the undesirable overshoot and/or backswing. Therefore, the time counter 24 can operate correctly and the distance to the dielectric weak point can be measured correctly. Further, the present invention replaces the pulse-transformer and rectifiers with a limiter 31, which is relatively inexpensive. Therefore, a whole test system can be manufactured at a reasonable price. Further, due to the presence of the limiter circuit, and arrester the whole circuit including the pulse amplifiers, are protected even though a high amplitude of impulse is applied to the circuit.

From the foregoing it will now be apparent that a new and improved cable test system which provides the accurate distance to the dielectric weak point and can be manufactured at a reasonable price, has been found. It should be understood, of course, that the embodiments disclosed are merely illustrative and are not intended to limit the scope of the invention. Reference should be made, therefore, to the appended claims rather than to the specification, as indicating the scope of the invention.

What is claimed is:

1. A cable test system consisting of a connector for connecting a cable to be tested to the system, a D.C. high voltage source connected between a terminal of said connector and the ground, a differentiation circuit connected to said terminal, a limiter circuit connected to the output of said differentiation circuit, first and second pulse amplifier means coupled to the output of said limiter circuit for amplifying the output thereof, said first amplifier means amplifying pulses of only a first polarity and said second amplifier means amplifying pulses of only an opposite polarity, a time counter connected to the outputs of said first and second pulse amplifier means so as to be started by the output of said first amplifier means and stopped by the output of said second pulse amplifier means and a display unit connected to the output of said time counter for displaying the distance from said connector to a dielectric weak point of the cable to be tested according to the output of said timer, wherein said first amplifier means comprises a first amplifier circuit which amplifies pulses of only one polarity and wherein said second amplifier means comprises a second amplifier which amplifies pulses of only said one polarity and an inverter circuit connected between the output of said limiter circuit and said second amplifier.

* * * * *